United States Patent [19]

Grapes et al.

[11] Patent Number: 4,867,235
[45] Date of Patent: Sep. 19, 1989

[54] COMPOSITE HEAT TRANSFER MEANS

[75] Inventors: Thomas F. Grapes, Columbia; Timothy M. Fertig, Pasadena; Mark S. Schroeder, Severna Park, all of Md.

[73] Assignee: Westinghouse Electric Corp., Pittsburgh, Pa.

[21] Appl. No.: 292,937

[22] Filed: Jan. 30, 1989

Related U.S. Application Data

[62] Division of Ser. No. 921,716, Oct. 20, 1986.

[51] Int. Cl.[4] ............................................. F28F 7/00
[52] U.S. Cl. .................................. 165/185; 165/80.3; 357/81; 361/388
[58] Field of Search ...................... 165/80.2, 80.3, 185, 165/905; 361/386, 388; 357/81

[56] References Cited

U.S. PATENT DOCUMENTS

| | | | |
|---|---|---|---|
| 3,611,046 | 10/1971 | Covert | 165/185 X |
| 3,913,666 | 10/1975 | Bayliss | 165/185 X |
| 4,134,451 | 1/1979 | Conant et al. | 165/180 X |
| 4,355,684 | 10/1982 | Caines | 165/905 X |
| 4,496,621 | 1/1985 | Hubert et al. | 165/905 X |

*Primary Examiner*—Ira S. Lazarus
*Assistant Examiner*—Peggy Neils
*Attorney, Agent, or Firm*—W. G. Sutcliff

[57] ABSTRACT

A thermal heat transfer member is disclosed for use with electronic or microwave systems. The thermal heat transfer member comprises a generally planar composite member is which elongated high thermal conductivity fibers are disposed within a matrix material. The matrix material may be an insulating epoxy or thermoplastic resin, while the fibers are elongated continuous commonly directed graphite fibers. The fiber ends terminate at a thermal contact surface which is interfaced with a heat sink. The thermal contact surface may be the transverse edge of the planar member or can be substantially parallel to the planar member. The fiber ends are inclined at an angle with respect to the plane of the planar member to provide for termination of the fibers at the thermal contact surface parallel to the planar member. Heat into the composite member is transferable along the commonly directed graphite fibers.

1 Claim, 3 Drawing Sheets

COMPOSITE HEAT TRANSFER MEANS

This is a division of application Ser. No. 921,716 filed Oct. 20, 1986.

BACKGROUND OF THE INVENTION

The present invention relates to thermal transfer means, and more particularly to thermal transfer means used in conjunction with electronic systems.

It is standard practice in electronic systems to utilize as thermal transfer means a conductive cooling thermal plane with printed circuit boards upon which are mounted heat generating electronic components and to use other thermal transfer means with rf modules and electronic chassis. Such thermal plane cooling makes use of aluminum or copper members mated to one or more printed circuit boards, with the thermal plane being interfaced with a heat sink at the edges of the thermal plane. A thermal transfer means as seen in U.S. Pat No. 4,602,678, comprises a silicone layer with embedded thermally conductive metal oxides. In copending application Ser. No. 878,102 (W. E. Docket No. 52,938) entitled "High Density Microelectronic Packaging Module For High Speed Chips" owned by the assignee of the present invention, an aluminum thermal plane is used for cooling printed circuit board attached to opposed sides of the thermal plane in a Standard Electronic Module. s For a variety of electronic applications, such a airborne or aerospace applications it is highly desirable to minimize the weight of the thermal transfer means. In particular, the aluminum thermal plane typically utilized may account for a not insignificant portion of the weight of the electronic package or system. It is therefore highly desirable to provide a lightweight, high efficiency heat transfer thermal plane for use with electronic systems.

A recent innovation in aerospace systems is the use of fiber reinforced composites for a variety of applications because of the high strength, lightweight character of such composites. A thermally conductive printed wiring board laminate is taught by U.S. Pat No. 4,609,586. The laminate combines a low coefficient of thermal expansion in the X-Y direction with thermal conductivity. The laminate comprises a support fabricated from a graphite reinforced matrix material adhesively secured to a printed wiring board of dielectric glass fiber reinforced resin. The graphite fibers are cross-plied in adjacent layers to provide the desired low coefficient of thermal expansion in the X-Y direction.

As mentioned above with respect to the copending application, conductive cooling of circuit board pairs, using what may be called a "thermal plane", is being emphasized for future electronic systems. In particular, conductive cooling using a thermal plane is being implemented in the Standard Electronic Module (SEM), which is a military standard configuration of two circuit boards which will be used in large quantities in various future systems.

In the SEM, as described in the aforementioned copending application, the circuit boards are permanently attached to the thermal plane using a conductive epoxy adhesive. The thermal plane is in turn non-permanently fixed within the chassis by wedgelocks along two side edges, and by a connector along the bottom edge.

From the point of view of the thermal plane, the circuit boards attached to it are weighted epoxy/glass laminates which generate heat. Two functions are provided by the thermal plane to the pair of boards. First, the thermal plane supports the circuit boards within the chassis. For this function, the thermal plane is required to possess sufficient strength to support the circuit boards during all anticipated situations of vibration and shock. The second function of the thermal plane is, as already mentioned, to provide a conductive path for the heat generated by the circuit board components. Heat flows into the thermal plane from the components mounted on the circuit boards. Heat then flows along the thermal plane, in opposite directions, to the thermal plane edges adjoining the heat sink walls. Finally, heat flows out of the thermal plane and passes into the tabs on the heat sink walls. Wedgelocks exert pressure on the thermal plane edges and the heat sink tabs to assure good thermal contact between the thermal plane and the heat sink tabs.

There is a significant difference in the size of the areas over which heat flows into and out of the thermal plane. Heat flow into the thermal plane is spread out over the relatively large side areas of the thermal plane. In comparison, the outward flow is concentrated over the relatively small contact areas between the thermal plane and the heat sink tabs. Heat flux (heat flow/area) is comparatively low into, and high out of, the thermal plane.

Overall, the weight of the thermal plane is to be minimized. It is known that of the two functions the thermal plane is required to perform, namely cooling and structural support of the attached circuit boards, cooling governs the thermal plane design. In other words, a thermal plane thick enough to have an acceptably low thermal resistance undoubtedly has adequate strength. In order to minimize weight, then, the material thermal conductivity should be maximized and the material density should be minimized. More concisely, the specific thermal conductivity (conductivity/density) should be maximized.

A class of graphite fibers has been developed which has very high thermal conductivity along the length of the fibers. Fibers in this special class are distinguished from typical graphite fibers in that the thermal conductivity of this class of fibers exceeds the conductivity of many metals. Whereas, the thermal conductivity of most graphite fibers is significantly less than that of metals. These high conductivity graphite fibers are of the "Pitch" type rather than the "PAN" type, and are manufactured by the Amoco Advanced Composite Corporation. Two types of conductive graphite fibers, designated P100 and P120, are of particular interest. Both fiber types have thermal conductivities along the length of the fiber greater than that of aluminum, with P120 being slightly higher than P1OO.

Graphite fibers are not used alone, but are mixed with a matrix material to create composite materials which possess structural characteristics. Composite materials formed of graphite fibers and a matrix typically possess high stiffness and strength. The matrix material used with graphite fibers is often an epoxy because of the good properties of the composite that result. For the conductive graphite fibers P100 and P120, the matrix material most used is an epoxy. Other matrix materials which can be used are metals, such as aluminum, and organic resins which are bondable to the fibers.

The baseline material for the prior art thermal plane can be considered to be aluminum. In addition to being the most common metal used in aircraft and aircraft electronic systems, aluminum also has a high specific conductivity compared to other metals. The specific conductivities of the new conductive graphite fiber composites, however, are much superior to that of aluminum. A complete comparison is presented in Table 1.

TABLE 1

| Comparison of Conductive Composites and Aluminum | | | |
| --- | --- | --- | --- |
| | P100/EPOXY | P120/EPOXY | 6061 ALUMINUM |
| DENSITY (lb./in) | 0.065 (112 lb/ft$^3$) | 0.065 (112 lb/ft$^3$) | 0.10 (173 lb/ft$^3$) |
| THERMAL CONDUCTIVITY (BTU ft/hr-ft$^2$-°F.) | 180. longitudinal 0.5 transverse | 222. longitudinal 0.5 transverse | 100. |
| SPECIFIC THERMAL CONDUCTIVITY (BTU-ft$^2$/lb-hr-°F.) | 1.61 longitudinal 0.0045 transverse | 1.98 longitudinal 0.0045 transverse | 0.578 |

The material properties presented in Table 1 for the composites are based on a specific volume percentage of fibers and epoxy. It can be appreciated that since the properties of the constituent materials (fiber, matrix) are different, the properties of the mixture are dependent on the relative amounts of the constituents present. The data is for a 60 percent fiber/40 percent epoxy mixture, which is the optimum mixture from the points of view of processing factors and cured material properties.

Considering the values presented in Table 1, it can be seen that P100 composite is 2.79 times better at conducting heat, per unit weight, than aluminum (1.61/.578=279). More specifically, P100 composite is 2.79 times better than aluminum when heat is conducted along the fibers (longitudinal direction). Perpendicular to the fibers (transverse direction), P100 composite actually conducts heat much poorer than aluminum. This fact can be understood when it is considered that the thermal conductivity of epoxy is very low (approximately 0.2 BTU-ft/hr-ft$^2$-°F.) and also the transverse conductivity of the fiber is very low, so that for heat to conduct through the composite perpendicular to the fibers, it must alternately pass through fibers transversely and the epoxy matrix between the fibers. Conversely, for heat conduction through the composite parallel to the fibers, virtually no heat passes through the epoxy, but rather it passes down the fibers themselves. This assumes that long continuous fibers rather than short "chopped" fibers are used. Any application of conductive graphite fiber composites for heat transfer must account for the poor transverse conductivities of the materials. Nevertheless, if conduction along the fibers is he means by which heat is carried, conductive composites offer great weight advantages compared to metals.

The total weight saved in a system by the use of conductive composite thermal planes instead of aluminum thermal planes can be appreciated by a hypothetical example. Assuming that the typical aluminum thermal plane is 5"×6"×0.080" and that 1000 thermal planes are used in a system, the total weight of aluminum thermal planes would be:

WT$_{AL}$=5.0×6.0×0.080×0.10×1000=240 lbs.

Assuming that P100 graphite/epoxy is only 2.0 times better than aluminum at conducting heat per unit weight (rather than 2.79) the weight of the P100 thermal planes would be 240/2 =120 lb., one-half the weight of aluminum thermal planes.

SUMMARY OF THE INVENTION

A thermal heat transfer member comprising a generally planar composite member in which elongated thermally conductive graphite fibers are disposed within a matrix material. The fibers are oriented predominantly in a common direction within the planar composite member, with at least at one end of the fibers inclined at an angle With respect to the plane of the composite member such that the fiber ends terminate at a peripheral thermal contact surface of the composite member. The thermal contact surface may be coplanar with or substantially parallel to a surface of the substantially planar composite member. Heat into the composite member is transferable along the commonly directed fibers, and is efficiently transferable from the composite member through the fiber ends at the thermal contact surface.

A thermal plane heat transfer member requires heat transfer multidirectionally away from the electronic component which generates the heat. The present invention utilizes a fiber embedded composite which conducts heat unidirectionally as a thermal plane to achieve significantly improved heat transfer performance.

The invention is useable in a wide variety of applications, ranging from the SEM embodiment with the composite heat transfer member bonded between printed circuit board laminates, to more generic thermal plane electronic applications, to use as a heat transfer member which is part of an electronic chassis or rf module.

A unique method of fabricating the composite thermal plane is also set forth.

DESCRIPTION OF THE PREFERRED EMBODIMENT

Figure 1:
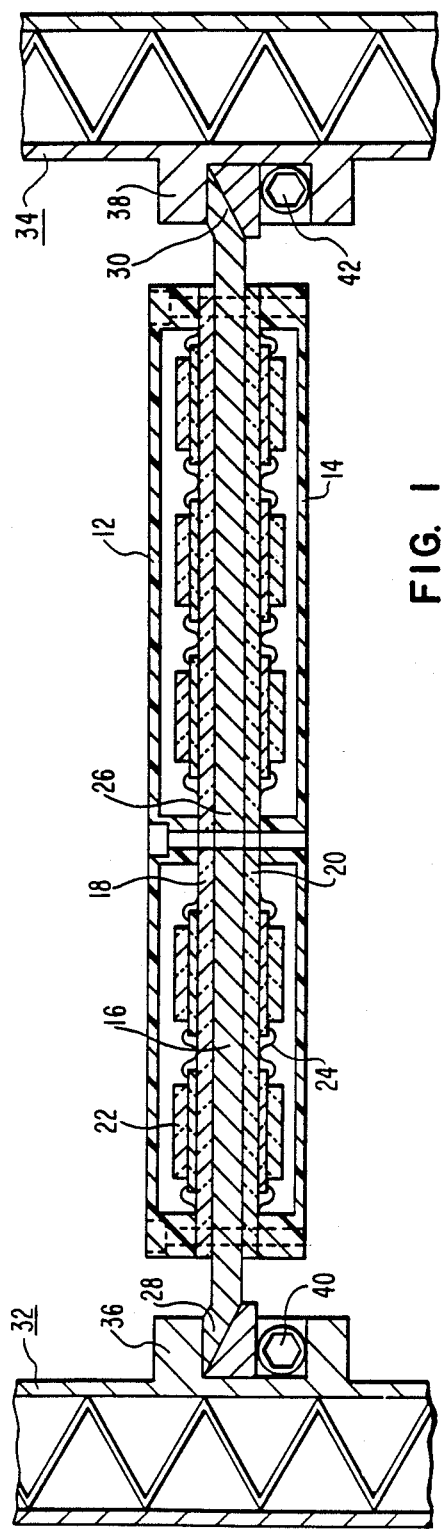
FIG. 1 is a side elevation view partly in section of a Standard Electronic Module utilizing a composite thermal plane per the present invention.

The invention can be best understood by reference to the embodiments seen in the Drawings. In FIG. 1, a Standard Electronic Module (SEM) 10 comprises a pair of mating cover members 12, 14 which are demountable about the composite thermal plane 16 which is bonded between printed circuit boards 18 and 20. A plurality of electronic component packages 22 are mounted upon the respective printed circuit boards 18, 20 and these component packages 22 may be interconnected by conductor patterns on the boards (not shown) and by wire bonds 24 extending between the packages 22 and the conductor patterns.

Figure 2:
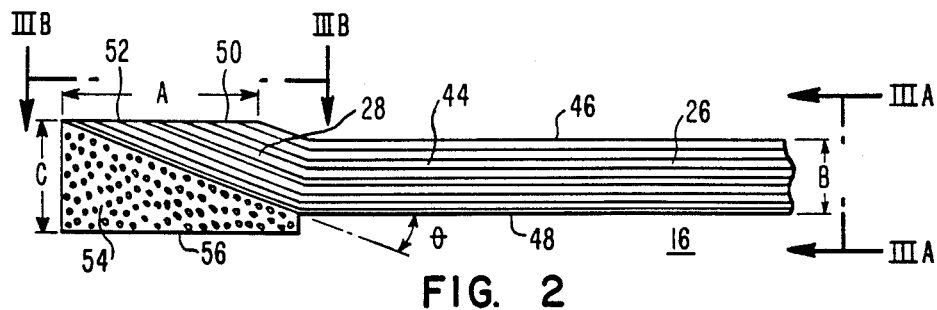
FIG. 2 is an enlarged side elevation view of one end of the composite thermal plane used in the embodiment of FIG. 1.

The composite thermal plane 16 a portion of which is seen more clearly in FIG. 2 comprises a generally planar composite member having a large area central heat flux input portion 26 and opposed peripheral heat flux output portions 2S, 30. The opposed peripheral heat flux output portions 28, 30 are respectively mounted to heat sinks 32, 34, which have thermal tabs 36, 38 which intimately contact the output portions 28, 30 with conventional wedgelock means 40, 42 engaging the output portions 28, 30 and forcing these portions into contact with the thermal tabs. The heat sinks and thermal tabs are formed of high thermal conductivity material such as aluminum which can be gas or fluid cooled.

The composite thermal plane 16 is seen in greater detail in the enlarged view of FIG. 2. This thermal plane 16 is a composite of high thermal conductivity fibers, such as graphite fibers, disposed within a matrix material. In the preferred embodiment, the high conductivity graphite fibers are P100 Thornel fibers, which is a trademarked material of Amoco Advanced Composites Corporation, and the matrix material is an epoxy resin. The composite thermal plane is 60 percent fiber by volume and 40 percent resin. The graphite fibers are oriented predominantly in a common direction parallel to the plane of the thermal plane. The graphite fibers have a nominal diameter of about 0.0005 inch, and are available embedded in prepreg epoxy layers which are about 0.005 inch thick in the cured state. The thermal plane is formed by laminating together the selected number of prepreg layers to arrive at the desired thickness for the thermal plane. By way of example, 20 layers of prepreg all with the graphite fibers aligned in a common direction are laminated together to provide a cured, laminated thermal plane which is 0.100 inch thick.

In the central heat flux input portion 26 of the thermal plane 16, the graphite fibers 44 are oriented in parallel and are parallel to the planar surfaces 46, 4B of the thermal plane 16. As seen more clearly in FIG. 2 peripheral output portion 28 is inclined at an angle with respect to the planar surfaces 46, 4S of the central portion 26 of the thermal plane. The graphite fibers 44 as well are inclined at this same angle at the output portion 28 and the fiber ends 50 terminate at a thermal contact surface 52 which is parallel to the planar surface 46. A wedge-shaped epoxy filler block member 54 is laminated to the inclined output portion, with the filler block having a surface 56 which is parallel to the thermal contact surface 52 and to the planar surface of the thermal plane. The thermal contact surface and the parallel filler block surface may be coplanar with the thermal plane surfaces or may each project beyond the planar opposed surfaces of the thermal plane to facilitate mounting to the heat sink. The incline angle 8 is seen in FIG. 2 and is readily varied but is determined to be $\theta = \sin^{-1} B/A$, where A is the desired heat sink tab contact length, B is the nominal thermal plane thickness, and C is the edge thickness, with $B \leq A$ and $B \leq C$. The incline angle $\theta$ can be varied so that the area consisting of exposed fiber ends can be matched with the heat sink tab thermal interface area. In general, the values A and C are standard for a given chassis, with the thermal plane thickness B being varied to handle the thermal load generated by a particular printed circuit board.

Figure 3B:
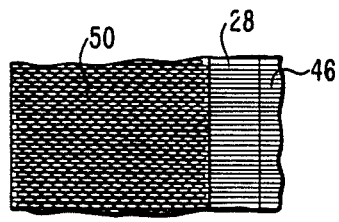
FIG. 3B is a cross-sectional representation taken along line B—B of FIG. 2.
Figure 3A:
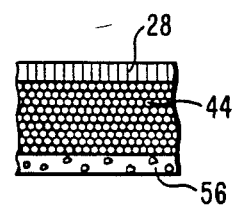
FIG. 3A is a cross-sectional representation taken along line A—A of FIG. 2.

The graphite fibers are seen in the cross-sectional view in FIG. 3A which is taken along line A—A of FIG. 2 through the central portion of the thermal plane, and illustrates the common directional alignment of the fibers. The thermal contact surface is seen in FIG. 3B which is a plan view taken along line B—B of FIG. 2. The fiber ends are terminated at the thermal contact surface. Heat enters the thermal plane wherever the electronic components are mounted upon the printed circuit board. The thermal conductivity of the composite thermal plane is high in the direction of fiber extension with the fiber being very effective in transferring heat along the fibers, with thermal conduction transverse to the fibers being low. Thus, heat transferred along the fibers passes through the fiber ends at the thermal contact surface and is transferred to the heat sink tabs.

The wedge-shaped filler block member is a high strength, low density material, compatible with the matrix material used in the composite thermal plane, and glass/epoxy has been found to be a suitable material for the filler block.

While the composite thermal plane of the present invention is inherently weak in the direction perpendicular to the fibers, the printed circuit boards which are bonded to the thermal plane provide the requisite strength in the direction perpendicular to the fibers.

Figure 4:
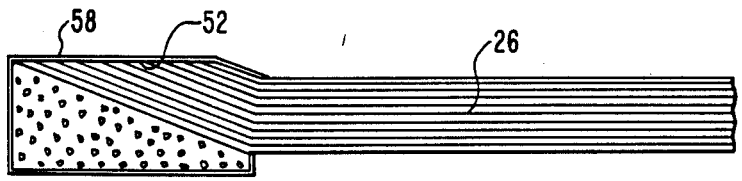
FIG. 4 is an enlarged side elevation view of one end of the composite thermal plane with a thin metal layer on the thermal contact surface.

It is desirable to isolate the graphite fibers at the thermal contact surface from direct contact with the aluminum heat sink tab because of galvanic corrosion of aluminum as a result of aluminum-graphite contact. In FIG. 4, a thin metal layer 58 is shown disposed over the thermal contact surface 52. A thin metallized layer of copper, tin, nickel, or compatible alloys may be plated or otherwise applied to the thermal contact surface to prevent direct graphite aluminum contact. A thicker metal cap may be soldered on the thermal contact surface either directly to the graphite or to a thin metallized layer as discussed above.

Figure 5:
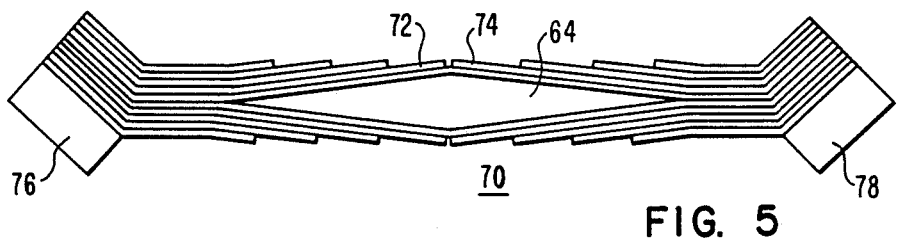
FIG. 5 is a representation of a preform of another embodiment composite thermal plane.
Figure 6:
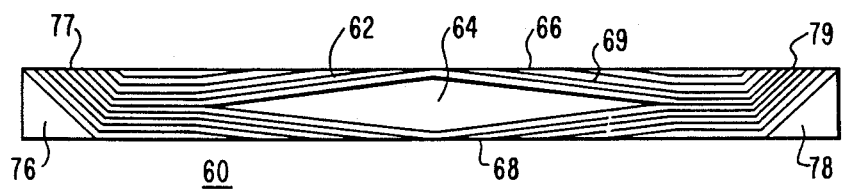
FIG. 6 is a representation of the finished composite thermal plane embodiment furnished from the FIG. 5 preform.

In another embodiment of the present invention seen in FIGS. 5 and 6, a finished thermal plane 60 is seen in FIG. 6 where in the central portion 62 of the thermal plane a low density filler material 64 is sandwiched between opposed fiber containing composite member surface portions 66, 68. In FIG. 6, the plurality of lines 69 shown on the thermal plane represent the fibers embedded within the composite thermal plane. FIG. 5 illustrates a molded preform 70 for the thermal plane, with a plurality of prepreg layers 72 shown about the filler material 64, with layer atop layer. The elongated conductive fibers are not seen in FIG. 5, but are embedded within the prepreg layers and extend parallel to the layer direction of extension. As seen in FIG. 5, the outermost prepreg layers are not continuous but consist of discrete layer portions such as 72, 74 which are spaced apart in the central area of the preform and are inclined at an angle with respect to the plane of the preform. The other outer prepreg layers are likewise spaced apart and inclined both in the central area and at their peripheral ends. In this way, the conductive fibers within the prepreg layers are likewise spaced apart and inclined. The highly conductive fibers extend in first and second generally opposed directions. The fibers each have centrally extending ends inclined at an angle to the planar surface of the composite member such that these centrally upwardly and downwardly extending inclined fibers terminate at the central area heat flux input portion of the thermal plane. The other ends of these fibers extend in opposed directions from the central portion to the peripheral portion of the composite member. These peripheral extending fiber ends are inclined at an angle to the plane of the composite member and terminate at a thermal contact surface. Filler blocks 76, 78 are provided at each end of the thermal plane. In FIG. 6, the preform of FIG. 5 has been machined to be planar at both opposed surfaces with a central portion being bondable to printed circuit boards on each side, and wherein planar thermal contact surfaces 77, 79 are provided at opposed peripheral edges of the thermal plane.

This embodiment of FIG. 6 provides improved thermal performance and weight reduction resulting from tapering or reducing the thickness of the conductive composite from the edges to the center portion. A low density material, such as glass microballoon filled resin fills the core central portion of the thermal plane.

Since the fibers terminate at the thermal plane surface in the central circuit board contact area where heat is inputted to the thermal plane, there is very efficient heat transfer along the fibers in opposed directions to the opposed peripheral thermal contact surfaces where the opposed ends of the fibers are terminated.

Improvement in thermal performance arises from the direct conduction of heat from the circuit boards into the ends of fibers, in a manner analogous to the way in which heat leaves the bent edge. Transverse conduction in the center section of the thermal plane, which occurs in the primary configuration, is eliminated. This aspect of the hollow core concept is particularly significant for thicker conductive composite thermal planes, where the temperature drop for heat flow into the thermal plane becomes more appreciable because of the longer transverse path length.

Thermal efficiency is maximized, and weight is consequently minimized, because all conductive composite material in the hollow core thermal plane carries the same amount of heat. If it is assumed that the heat from the circuit boards enters the thermal plane uniformly, then the heat flow at any location in the center section of the thermal plane is proportional to the distance of the location from the mid-line of the thermal plane. By tapering the conductive composite material in the same way that the total heat flow varies, all composite material in the thermal plane carries the same heat flow.

Figure 7:
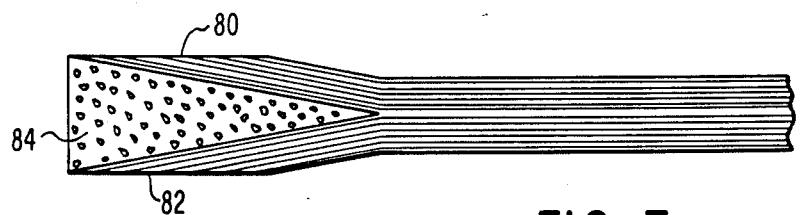
FIG. 7 is a representation of yet another embodiment composite thermal plane.

In yet another embodiment seen in FIG. 7 the conductive fibers at the thermal plane periphery are inclined at equal opposed angles relative to the plane of the thermal plane such that half the fibers terminate at an upper thermal contact surface, and the other half of the fibers terminate at a lower thermal contact surface. A wedge-shaped filler block is disposed between these upper and lower thermal contact surfaces. This design permits heat to be transferred from both sides of the thermal plane.

Figure 8:
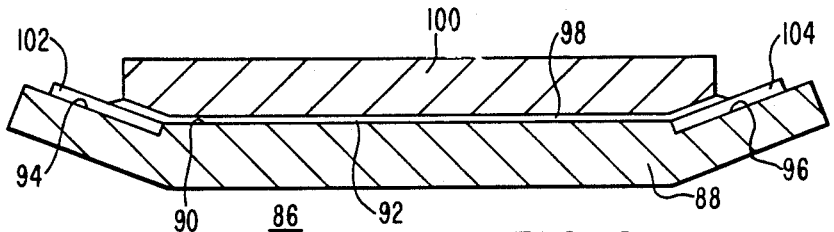
FIG. 8 illustrates in schematic fashion the molding equipment used in the fabrication process of the present invention.

FIG. 8 shows a representation of the molding apparatus 86 utilized in the method of fabricating the present invention for fabricating the composite thermal plane of the present invention. The composite thermal plane is molded in the apparatus which includes a bottom mold 88 with a bottom mold surface 90 which has a planar central area 92 which corresponds to the central heat flux input portion of the desired thermal plane. This bottom mold 88 has opposed peripheral surface portions 94, 96 which are inclined upwardly at a predetermined angle. The desired number of elongated highly conductive graphite fiber composite prepregs epoxy layers 98 are disposed upon the bottom mold surface in an uncured state. The fibers are oriented predominantly in a common direction parallel to the bottom mold surface. A mating mold top surface 100 is placed over the composite prepreg material and heat and pressure are applied to mold and cure the epoxy material forming the planar composite thermal plane with peripheral edge portions inclined at an angle relative to the planar composite member such that the fiber ends at the peripheral edge portion are likewise inclined at an angle to the planar composite member. Peripheral thermal contact surfaces are formed during subsequent fabricating steps at these peripheral edges with the fiber ends terminating at these thermal contact surfaces.

Cured glass/epoxy blocks 102, 104 are placed in the bottom of the mold and layers of uncured graphite/epoxy prepreg are placed over them and the rest of the mold bottom. The mold is closed by putting the mold top in place. Heat and pressure are applied to cure the graphite/epoxy and simultaneously bond the glass/epoxy blocks to the graphite/epoxy. After removal from the mold, the part is machined to final shape. During the machining operation, fiber ends are clearly exposed in the thermal contact areas. Optionally, plating and perhaps soldering of metal caps to the thermal contact areas is performed. The thermal heat transfer members of the present invention can be fabricated by other composite molding processes, such as resin transfer molding where the commonly aligned graphite fibers are disposed and held in place within a mold into which resin is injected to form the composite.

Figure 10:
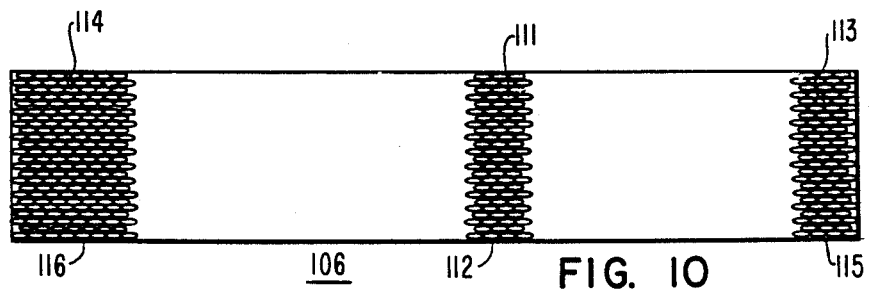
FIG. 10 is a plane view representation of the embodiment of FIG. 9.
Figure 9:
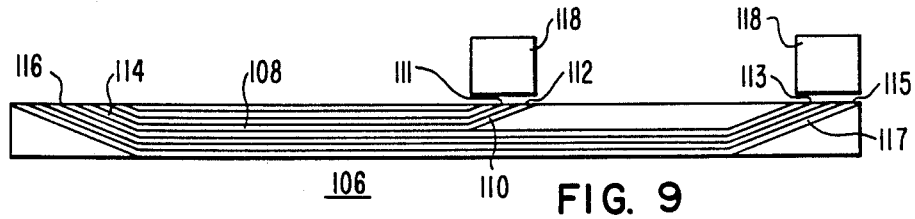
FIG. 9 is a side elevation representation of still another embodiment of the present invention.

In yet another embodiment of the invention seen in FIGS. 9 and 10, the composite thermal plane 106 has elongated highly conductive fibers 108 which extend predominantly in a common direction, and with some portion of the fibers terminating at a central portion 110 of the thermal plane and being inclined at the terminating central portion at an input thermal contact surface 112 at which fiber ends 111 are terminated. The other ends 114 of the fibers terminate at a peripheral edge of the thermal plane at an output thermal contact surface 116. In FIG. 9, the thermal plane is seen in a side elevation representation with electronic components 118 mounted on the input thermal contact surfaces 112. The output thermal contact surface 116 can then be interfaced with a heat sink. Some portion of the conductive fibers 108 are continued past the central portion 110 and extend to a peripheral portion 117 of the thermal plane 106. The fiber ends 113 at this peripheral portion 117 are inclined at an angle to the plane of the thermal plane and terminate at another thermal contact surface 115 upon which another electronic component 118 is shown. FIG. 10 is a plan view of the FIG. 9 thermal plane with the electronic components removed illustrating how the fibers terminate at the input and output thermal contact surfaces.

Figure 11:
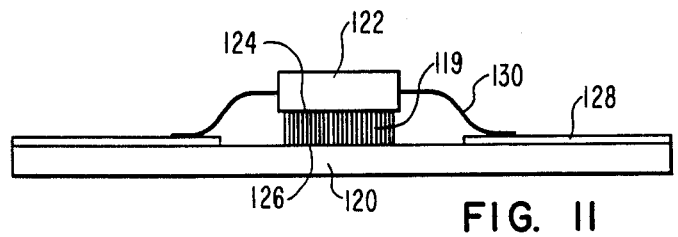
FIG. 11 illustrates in side elevation another embodiment of the present invention.

FIG. 11 is a side elevation view of another embodiment of the present invention wherein a composite thermal block 11B is mounted upon a heat sink 120 with an electronic component 122 mounted upon the composite thermal block. The composite thermal block comprises elongated, high conductivity fibers disposed within a matrix material, with the fibers extending all in the same direction. The fiber ends terminate at the opposed upper and lower thermal contact surfaces. The upper thermal contact surface 124 is in contact with the heat generating electronic component, while the lower thermal surface 126 contacts the heat sink. The fibers are highly efficient heat transfer means. The electronic component is seen connected to a printed wiring board 12S disposed upon the heat sink, with wire bond connections 130 extending between the component and the printed wiring board.

Figure 12:
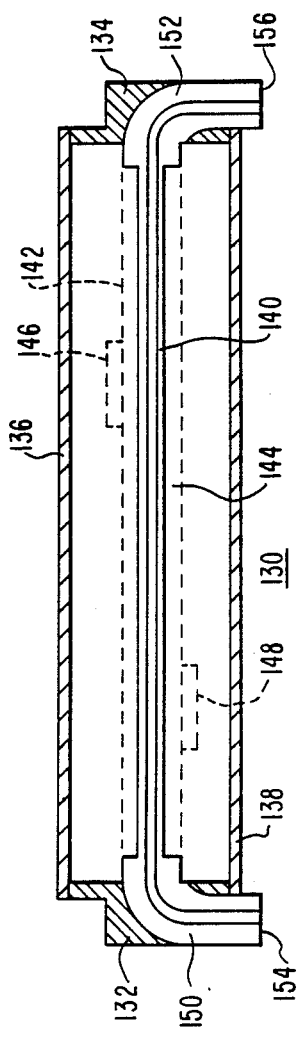
FIG. 12 is an elevational view of a microwave module in which a thermal heat transfer member of the present invention is an integral part of the module.

In FIG. 12, in yet another embodiment of the present invention an rf or microwave module 130 or chassis member has conductive side walls 132, 134, and conductive covers 136, 138 which may be hermetically sealed to the side walls 132, 134. A central web member 140 extends between the side walls 132, 134 within the module 130. The web member 140 is a generally planar member upon which insulating substrates 142, 144 are mounted as seen in dashed line fashion, with microwave components 146, 148 mounted thereon, also in dashed line fashion. Monolithic microwave devices may be fabricated upon the insulating substrates. Microwave or rf energy is fed into and out of the module via connectors which are not shown but which fed through the side walls. The web member is a thermal heat transfer member for removing heat generated by the microwave components and circuitry. The web member is generally planar but has end portions 150, 152 which are curved or angled to be transverse to the plane of the web member. These end portions 150, 152 are bonded or otherwise connected to the side walls 132, 134. The web member is a composite material including a matrix with elongated graphite fibers within the matrix material which is typically epoxy resin. These elongated graphite fibers extend continuously along the planar web and are curved or angled with the end portions 150, 152, and are terminated at the thermal contact surfaces 154, 156. Heat generated by the microwave components can thus be transferred to the web member and along the graphite fibers to the thermal contact surfaces which can be interfaced with a heat sink.

In summary, high conductivity graphite fibers, embedded in an appropriate matrix, can perform the same as or better than aluminum and weigh significantly less. Orienting fibers in the direction of heat flow efficiently uses the conductive graphite fibers to best advantage. The low transverse conductivity of the conductive composite materials can be overcome by slanting the fibers toward the heat sources/sinks. Both single direction and bidirectional heat flow at the heat sink edges can be accommodated. A hollow core design reduces weight further and permits a thick thermal plane to be used. Corrosion and physical damage can be avoided by covering the thermal contact areas with compatible metal.

What is claimed:

1. A thermal heat transfer member comprising a generally planar composite member having a large area central heat flux input portion and at least one peripheral heat flux output portion, which composite member comprises a matrix material in which elongated conductive graphite fibers are disposed, which fibers are oriented predominantly in at least first and second opposed directions from the central heat flux input portion, with all of the fibers extending in said first and second directions having centrally extending ends inclined at a slight angle to the plane of the composite member such that said centrally extending inclined fiber ends terminate at the heat flux input surface, and the other ends of said fibers extending in said first and second direction to the periphery of said composite member being inclined at an angle to the plane of the composite member such that said peripherally extending fiber ends terminate at a first and second heat transfer surface of the peripheral heat flux output portion, with a substantial portion of the central heat flux input portion of the composite member consisting of opposed composite member surface portions with a low density filler material sandwiched between the opposed composite member surface portions.

* * * * *